US009455164B2

(12) United States Patent
Zhang et al.

(10) Patent No.: US 9,455,164 B2
(45) Date of Patent: Sep. 27, 2016

(54) LASER ANNEALING APPARATUS AND LASER ANNEALING METHOD

(71) Applicant: Shanghai Micro Electronics Equipment Co., Ltd., Shanghai (CN)

(72) Inventors: Jun Zhang, Shanghai (CN); Zhidan Li, Shanghai (CN); Zhe Li, Shanghai (CN)

(73) Assignee: SHANGHAI MICRO ELECTRONICS EQUIPMENT CO., LTD., Shanghai (CN)

( * ) Notice: Subject to any disclaimer, the term of this patent is extended or adjusted under 35 U.S.C. 154(b) by 143 days.

(21) Appl. No.: 14/385,464

(22) PCT Filed: Jul. 19, 2013

(86) PCT No.: PCT/CN2013/079697
§ 371 (c)(1),
(2) Date: Sep. 15, 2014

(87) PCT Pub. No.: WO2014/015765
PCT Pub. Date: Jan. 30, 2014

(65) Prior Publication Data
US 2015/0037984 A1     Feb. 5, 2015

(30) Foreign Application Priority Data

Jul. 25, 2012   (CN) .......................... 2012 1 0258008

(51) Int. Cl.
| | |
|---|---|
| *H01L 21/67* | (2006.01) |
| *B23K 26/06* | (2014.01) |
| *B23K 26/067* | (2006.01) |
| *B23K 26/00* | (2014.01) |
| *B23K 26/08* | (2014.01) |
| *H01L 21/324* | (2006.01) |
| *H01L 21/268* | (2006.01) |
| *H01S 3/00* | (2006.01) |

(52) U.S. Cl.
CPC ..... *H01L 21/67115* (2013.01); *B23K 26/0006* (2013.01); *B23K 26/0066* (2013.01);
(Continued)

(58) Field of Classification Search
CPC ............. H01L 21/268; H01L 21/324; H01L 21/67115; B23K 26/067; B23K 26/082; B23K 26/0622; B23K 26/064; B23K 26/0604; B23K 26/0648; B23K 26/0066
See application file for complete search history.

(56) References Cited

U.S. PATENT DOCUMENTS

| | | | | |
|---|---|---|---|---|
| 5,293,389 A | * | 3/1994 | Yano ..................... | B23K 26/032 372/21 |
| 8,383,982 B2 | * | 2/2013 | Bruland ............. | B23K 26/0613 219/121.69 |
| 2011/0222863 A1 | * | 9/2011 | Bickham ............ | H04B 10/2937 398/142 |

FOREIGN PATENT DOCUMENTS

| | | |
|---|---|---|
| CN | 1900723 A | 1/2007 |
| CN | 101350494 A | 1/2009 |

(Continued)

OTHER PUBLICATIONS

G.D. Ivlev et al., "Liquid Phase Reflectivity under Conditions of Laser-Induced Silicon Melting," Semiconductors, vol. 34, No. 7, 2000, pp. 759-762.

(Continued)

*Primary Examiner* — Michael Trinh
(74) *Attorney, Agent, or Firm* — Muncy, Geissler, Olds & Lowe, P.C.

(57) ABSTRACT

A laser annealing apparatus includes: a laser beam generator for providing a stable single-pulse laser; a cyclic delay unit (300) for splitting the single-pulse laser into several pulsed lasers; an optical module for converging one or more of the pulsed lasers on a substrate (204); and a movable stage (500) for providing the substrate (204) with movement in at least one degree of freedom. A laser annealing method includes: providing a stable single-pulse laser; splitting the single-pulse laser into several pulsed lasers according to a delay requirement and an energy ratio; and irradiating a substrate (204) successively with one or more of the pulsed lasers to keep a surface temperature of the wafer around the melting point or around a needed annealing temperature for a sufficiently long time during the annealing process, thus resulting in an improvement in both the laser energy utilization efficiency and effect of the annealing process.

9 Claims, 5 Drawing Sheets

(52) U.S. Cl.
CPC ......... *B23K26/067* (2013.01); *B23K 26/0622* (2015.10); *B23K 26/0648* (2013.01); *B23K 26/0853* (2013.01); *H01L 21/324* (2013.01); *B23K 2201/40* (2013.01); *B23K 2203/56* (2015.10); *H01L 21/268* (2013.01); *H01S 3/005* (2013.01)

(56) References Cited

FOREIGN PATENT DOCUMENTS

| JP | 5-29693 A | | 2/1993 |
|---|---|---|---|
| JP | 2000-244036 | * | 9/2000 |
| JP | 2000-244036 A | | 9/2000 |
| JP | 2006-135251 A | | 5/2006 |
| JP | 2010-177609 A | | 8/2010 |
| JP | 2012-015463 | | 1/2012 |

OTHER PUBLICATIONS

X. Wang, "Pulsed Laser Annealing and Rapid Thermal Annealing of Copper—Indium—Gallium-Diselenide-Based Thin-Film Solar Cells," A Dissertation Presented to the Graduate School of the University of Florida, 2005, 186 pp.

* cited by examiner

LASER ANNEALING APPARATUS AND LASER ANNEALING METHOD

TECHNICAL FIELD

The present invention relates to the field of semiconductor material processing, and in particular, to a laser annealing apparatus and a laser annealing method.

BACKGROUND

Annealing is a thermal process to expose a target material to a high temperature for a long time and then cool it down slowly. Traditional furnace annealing is incapable of thoroughly eliminating defects in crystals even at a temperature up to 1100° C., while semiconductor laser annealing allows relative thorough removal of such defects. Laser light wavelengths that can be used in semiconductor laser annealing span a wide spectrum, from the ultraviolet (UV) region to the infrared (IR) region, and there have been developed a variety of semiconductor laser annealing methods, such as the single-pulse laser annealing disclosed in U.S. Pat. No. 6,336,308 (issued on Jan. 8, 2002) and U.S. Pat. No. 7,365,285 (issued on Apr. 29, 2008), high-frequency Q-switch pulsed laser annealing, scanning continuous-wave laser annealing, same-wavelength double-pulse scanning laser annealing, dual-wavelength double-pulse scanning laser annealing, etc.

Double-pulse laser annealing is superior to single-pulse laser annealing in performance in terms of implanted ion activation, as described in the references, "Silicon Laser Annealing by a Two-Pulse Laser System with Variable Pulse Offsets" by V. Gonfa et al., "Laser Annealing of Double Implanted Layers for IGBT Power Devices", by Clement Sabatier et al., and "UL Dual Beam Laser Spike Annealing Technology". There are two types of double-pulse laser annealing. One is to irradiate two laser pulses of the same wavelength onto a silicon surface at different instants of time (See, e.g., V. Gonfa et al., "Silicon Laser Annealing by a Two-Pulse Laser System with Variable Pulse Offsets", and Clement Sabatier et al., "Laser Annealing of Double Implanted Layers for IGBT Power Devices"). The other is to first preheat the silicon surface with long-wavelength continuous or pulsed laser radiation and then anneal the silicon surface with short-wavelength laser radiation (See, e.g., "UL Dual Beam Laser Spike Annealing Technology"). At present, laser annealing apparatuses that employ the double-pulse schemes have started to be used in the fields of insulated-gate bipolar transistors (IGBTs), thin-film transistors (TFTs) and the like.

As disclosed in the prior art of "Liquid Phase Reflectivity under Conditions of Laser Induced Silicon Melting", in the course of laser annealing, after the silicon surface is melted, the formed liquid silicon has a reflectivity two times that of solid silicon, thus causing an additional part of the laser energy to be reflected off rather than absorbed in the silicon material. This will reduce the laser energy utilization efficiency and hence harming the performance of the annealing process.

This problem is commonly associated with conventional single- and double-pulse laser annealing methods. If elongating the time delay between the two laser pulses, this may lead to an overly low temperature across a certain time frame that fails to meet the annealing requirement (i.e., the temperature should be kept over 1300° C. for at least 50 ns). Further, in some applications (e.g., the annealing described in the prior art reference of "Sub-Melt Laser Annealing Followed by Low-Temperature RTP for Minimized Diffusion" by S. B. Felch, D. F. Downey, E. A. Arevalo, et al. of the Varian Semiconductor Equipment Associates, Inc., 811 Hansen Way, Palo Alto, Calif., 94303-0750, USA, and the solar energy annealing described in the prior art reference of "Pulsed Laser Annealing and Rapid Thermal Annealing of Copper-Indium-Gallium-Diselenide-Based Thin-Film Solar Cells"), a desirable annealing effect is obtainable at a temperature not exceeding the silicon melting point of 1414° C.

No matter a single- or double-pulse laser annealing method is used, when the temperature exceeds the silicon melting point, the laser energy absorption will drop by half and the utilization efficiency will decrease correspondingly. In addition, it is possible for the two annealing methods described above to fail to maintain a desired annealing temperature (e.g., 1100° C., at which an activation efficiency of 90% is achievable) for a sufficiently long period of time (e.g., ≥100 ns) and to thus have an undesirable annealing effect. Therefore, improvements in energy utilization efficiency and annealing effect are particularly desirable in the field of laser annealing.

SUMMARY OF THE INVENTION

It is therefore an objective of the present invention to provide a laser annealing apparatus and a laser annealing method, capable of splitting a single-pulse laser beam into a plurality of pulsed laser beams according to a desired time delay and an energy ratio and annealing an object with the pulsed laser beams.

In pursuit of this objective, according to a first aspect, the invention provides a laser annealing apparatus which includes: a laser beam generator for providing a stable single-pulse laser beam; a cyclic delay unit for splitting the single-pulse laser beam into a plurality of pulsed laser beams; an optical module for converging one or more of the plurality of pulsed laser beams on a substrate; and a movable stage for providing the substrate with a movement in at least one degree of freedom.

Preferably, the cyclic delay unit at least includes a delayer, a beam splitter unit and an internal control module, and the internal control module is configured to control a time delay of the delayer and a beam-splitting ratio of the beam splitter unit.

Preferably, the cyclic delay unit further includes a plurality of optical fibers for transmitting a laser beam between the beam splitter unit and the delayer.

Preferably, the delayer includes: two reflectors having parallel reflecting surfaces; and an exit and an entrance, each adjustable in orientation or position.

Preferably, the exit and entrance are implemented as a transmitter and a receiver, respectively, or an exit reflector and an entrance reflector, respectively.

Preferably, the internal control module controls the time delay of the delayer by adjusting the orientation and/or position of any or both of the exit and the entrance.

Preferably, the beam splitter unit includes a plurality of first beam splitters having different transmittances and a pivot, and the internal control module controls the beam-splitting ratio of the beam splitter unit by driving the pivot to switch the first beam splitter in use.

Preferably, the first beam splitters are spaced the same distance from the pivot.

Preferably, the laser annealing apparatus further includes a master controller which is connected to the internal control module and configured to send a command indicative of a time delay and a beam-splitting ratio to the internal control module.

Preferably, the laser beam generator includes a laser, a dimmer, a second beam-splitter, an energy detector, a laser controller and an environmental control unit; the single-pulse laser beam is provided by the laser and is split into a major part and a minor part by the second beam-splitter after the laser beam has exited the laser and traveled through the dimmer; the major part of the laser beam enters the cyclic delay unit; the minor part of the laser beam enters the energy detector; the energy detector measures the energy of the minor part and transfers the measurement results to the laser controller; the environmental control unit obtains operating environment information of the laser and transfers the information to the laser controller; the laser controller controls the operation of the laser based on the measurement results from the energy detector and the information from the environmental control unit; and the laser controller and the environmental control unit are both under control of the master controller.

Preferably, the optical module includes a beam expander, a beam homogenizer, a first focusing lens group, a third beam splitter, a second focusing lens group and a focal plane detector; the plurality of pulsed laser beams, exited from the cyclic delay unit, each successively passes through the beam expander and beam homogenizer, and is then split into two parts by the third beam splitter; one part of each of the plurality of pulsed laser beams passes through the first focusing lens group and is thereby directed onto a surface of the substrate; the other part of each of the plurality of pulsed laser beams passes through the second focusing lens group and is thereby directed onto the focal plane detector; the focal plane detector obtains focal plane information and outputs the focal plane information to the master controller; and the master controller controls movement of the movable stage based on the focal plane information so as to move the substrate to an optimal focal plane position.

According to a second aspect, the invention provides a laser annealing method which includes: providing a stable single-pulse laser beam; splitting the single-pulse laser beam into a plurality of pulsed laser beams according to a desired time delay and an energy ratio; and irradiating a substrate successively with one or more of the plurality of pulsed laser beams to maintain a surface temperature of the substrate within a predetermined range.

Preferably, splitting the single-pulse laser beam into the plurality of pulsed laser beams according to the desired time delay and the energy ratio includes: a) selecting a first beam splitter according to a preset beam-splitting ratio; b) splitting the single-pulse laser beam into two pulsed laser beams with the first beam splitter, irradiating the substrate with one of the two pulsed laser beams, and delaying the other of the two pulsed laser beams by the desired time delay with a delayer; c) splitting the other of the two pulsed laser beams that has exited the delayer into further two pulsed laser beams with the first beam splitter, irradiating the substrate with one of the further two pulsed laser beams, and delaying the other of the further two pulsed laser beams by the desired time delay with the delayer; and d) repeating step c), or selecting another first beam splitter according to another preset beam-splitting ratio and repeating step c).

Preferably, the delayer includes: two reflectors having parallel reflecting surfaces; and an exit and an entrance, each adjustable in orientation or position.

Preferably, adjusting the orientation or position of any or both of the exit and the entrance results in an adjustment in the time delay realized by the delayer.

Preferably, the exit and entrance are implemented as a transmitter and a receiver, respectively, or an exit reflector and an entrance reflector, respectively.

The laser annealing apparatus and the laser annealing method of the invention can split a single-pulse laser beam into multiple pulsed laser beams according to a desired time delay and an energy ratio and irradiate a target wafer successively with the multiple laser beams so as to keep a surface temperature of the wafer around the melting point of the wafer material or around a needed annealing temperature for a sufficiently long time during the annealing process, thus improving the laser energy utilization efficiency and the annealing effect.

BRIEF DESCRIPTION OF DRAWINGS

FIG. 4b is a side view of FIG. 4a.

DETAILED DESCRIPTION OF EXEMPLARY EMBODIMENTS

As already described above in the Background section, the conventional pulse width adjustment methods will cause the temperature of a substrate being treated to exceed the melting point of the substrate material a certain time after the start of the annealing process, thus leading to intensive and increased reflection of the incident laser energy. Further, the continuous increase of the substrate temperature during the annealing process will induce increasingly higher thermal radiation and thus cause the volatilization of ions implanted in the substrate. In addition, while the existing double-pulse annealing can realize laser energy dispersion and hence have a better annealing effect than that of the existing single-pulse annealing, the laser annealing apparatus and the laser annealing method of the present invention can split a single-pulse laser beam into multiple pulsed laser beams according to a desired time delay and an energy ratio without needing additional lasers, thus can achieve a further improved annealing effect than the double-pulse annealing with low cost. Successively irradiating a target wafer with these laser beams can keep a surface temperature of the wafer around the melting point of the wafer material or around a needed annealing temperature for a sufficiently long time during the annealing process, thus resulting in an improvement in both the energy utilization efficiency and annealing effect.

The present invention will be described in greater detail in the following description which demonstrates preferred embodiments of the invention, in conjunction with the accompanying drawings. Those skilled in the art should, in light of the present disclosure, appreciate that many changes can be made in the specific embodiments disclosed herein and still obtain the same beneficial results. Therefore, the following description should be construed as the illustrative of the principles of the present invention, and not providing limitations thereto.

For simplicity and clarity of illustration, not all features of the specific embodiments are described. Additionally, descriptions and details of well-known functions and structures are omitted to avoid unnecessarily obscuring the invention. The development of any specific embodiment of the present invention includes specific decisions made to achieve the developer's specific goals, such as compliance with system related and business related constraints, which will vary from one implementation to another. Moreover, such a development effort might be complex and time consuming but would nevertheless be a routine undertaking for those of ordinary skill in the art.

The following examples serve to illustrate, with reference to the accompanying drawings, the present invention in more detail. Features and advantages of the invention will be apparent from the following detailed description, and from the appended claims. Note that the accompanying drawings are provided in a very simplified form not necessarily presented to scale, with the only intention of facilitating convenience and clarity in explanation.

A principal concept of the present invention is to use a cyclic delay unit to split a single-pulse laser beam into multiple pulsed laser beams and use an optical module to make the multiple pulsed laser beams converge on a substrate, such that with the substrate being continuously irradiated by these pulsed laser beams, the surface temperature of the substrate can be maintained around the melting point of the substrate material or around a needed annealing temperature for a sufficiently long time during the annealing process. This can prevent the substrate surface from being melted when it is heated to a temperature exceeding the substrate material melting point and thus prevent increased reflection off of laser energy caused by a higher reflectivity of melted substrate material, thereby resulting in an improvement in both the laser energy utilization efficiency and annealing effect.

Figure 1:
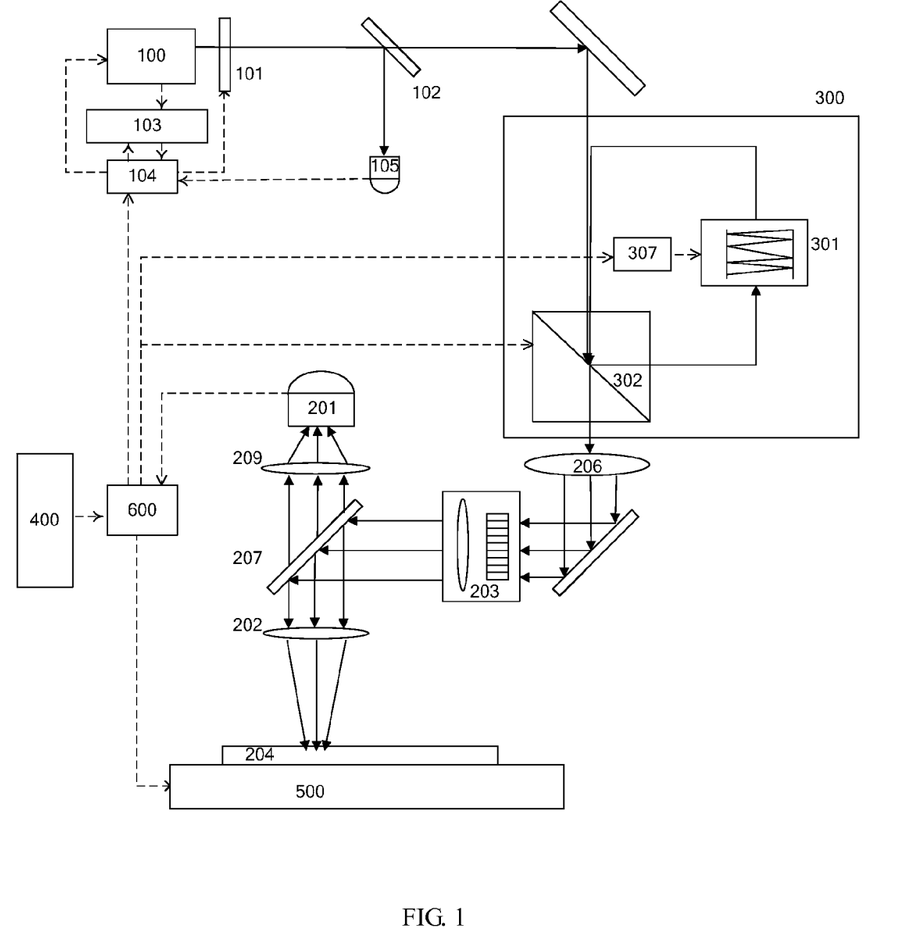
FIG. 1 is an overall schematic illustration of a laser annealing apparatus in accordance with the present invention.

Turning now to FIG. 1, which is an overall schematic illustration of a laser annealing apparatus in accordance with the present invention. The laser annealing apparatus includes:

a laser beam generator for providing a stable single-pulse laser beam;

a cyclic delay unit 300 for splitting the single-pulse laser beam into a plurality of pulsed laser beams;

an optical module for making the pulsed laser beams converge on a substrate 204, where the substrate 204 is an object to be annealed, made of a semiconductor or other material, and in this embodiment, the substrate is a silicon wafer; and a movable stage 500 for providing the substrate 204 with movement in at least one degree of freedom. The substrate 204 is placed on the stage 500, and the stage 500 itself is movable in several degrees of freedom.

Preferably, the laser annealing apparatus further includes a master controller 600 which is connected to an internal control module 307 for sending a command indicative of a time delay and a light-splitting ratio to the internal control module 307 inside the cyclic delay unit 300. The control module 307 of the cyclic delay unit 300 performs control, according to the command from the master controller 600, to make the pulsed laser beams emitted by the cyclic delay unit 300 be applied with the time delay and make the cyclic delay unit 300 realize the light-splitting ratio (i.e., an energy ratio). Of course, the master controller 600 can directly perform control to realize the application of time delay to the pulsed laser beams and realize the light-splitting ratio (i.e., an energy ratio) of the cyclic delay unit 300.

Further, in a complex apparatus, a computer 400 is separate from the master controller 600. Upon receiving the command from the computer 400, the master controller 600 converts the command to executable signals and allocates the signals down to sub-controllers through a bus for its execution.

Figure 2:
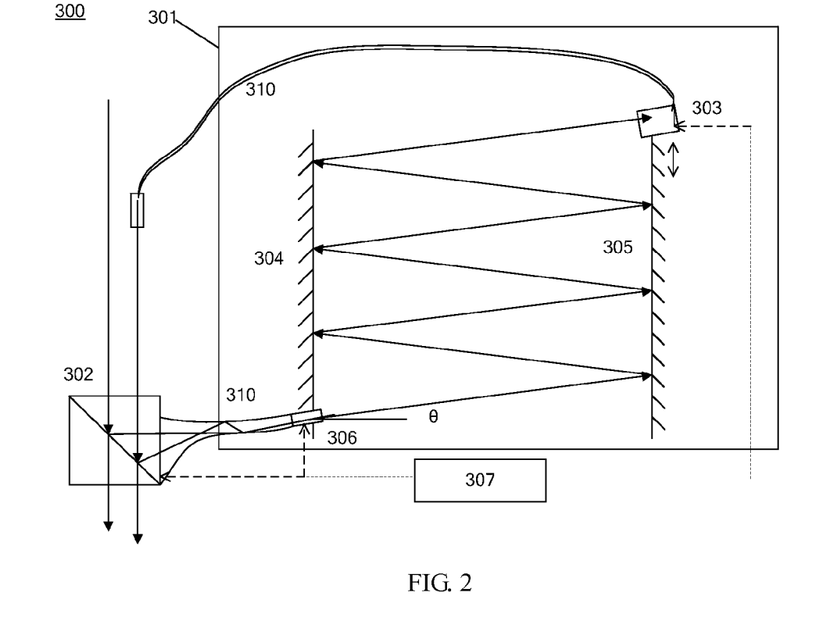
FIG. 2 shows a schematic view of Embodiment 1 of a cyclic delay unit of the laser annealing apparatus in accordance with the present invention.

Referring to FIG. 2 which is a schematic illustrating the cyclic delay unit of the laser annealing apparatus in accordance with Embodiment 1 of the present invention. The cyclic delay unit 300 at least includes a delayer 301, a beam splitter unit 302 and the internal control module 307. The delayer 301 is operative to adjust the time delay of the pulsed laser beams according to a specific need, and the beam splitter unit 302 is configured to adjust the light-splitting ratio. The internal control module 307 is connected to both the delayer 301 and the beam splitter unit 302, so as to control the time delay of the delayer 301 and the light-splitting ratio of the beam splitter unit 302.

Preferably, the cyclic delay unit 300 further includes a number of optical fibers 310 for transmitting laser beams between the beam splitter unit 302 and the delayer 301.

Referring again to FIG. 2, the delayer 301 includes: two reflectors 304 and 305 having parallel reflecting surfaces; and an exit and an entrance, each adjustable in orientation or position. Control of the internal control module 307 over the time delay of the delayer 301 is realized by adjusting the orientation and/or position of any or both of the exit and the entrance. In a preferred embodiment, the exit and entrance are implemented as a transmitter 303 and a receiver 306, respectively. Additionally, the reflectors 304 and 305 are so disposed that their reflecting surfaces are in parallel. Further, the orientation of the transmitter 303 and the position of the receiver 306 are adjustable each within a range that is controlled by the control module 307. Suppose the transmitter 303 allows a laser beam to exit at an angle θ, the reflectors 304 and 305 have a gap distance L and the same height H, each optical fiber 310 of the cyclic delay unit 300 has a length L0, and the optical path from the exit of each optical fiber 310 to the transmitter 303 has a length L1, the total optical path length X the laser beam travels in the cyclic delay unit 300 for each cycle is given by:

$$X = L1 + n*L0 + \mathrm{mod}(H/(L*tg(\theta)))*L*\sec(\theta) \quad \text{(Formula 1)}$$

where, mod is a function which result is the integer part of a number, or is the sum of the integer part and 1 if the integer part is an even number, and n denotes the refractivity of the material of the optical fibers 310. Then, a period the laser beam is delayed by for each cycle of its propagation in the cyclic delay unit 300 is given by:

$$T = X/c \quad \text{(Formula 2)}$$

With such relationships, when the internal control module 307 receives a request from the master controller 600 for a time delay T, the corresponding needed exit angle θ can be calculated by formulae 1 and 2, and the internal control module 307 then instructs the transmitter 303 to realize the exit angle θ and adjusts the receiver 306 to a position that allow convenient laser beam entrance.

Figure 4A:
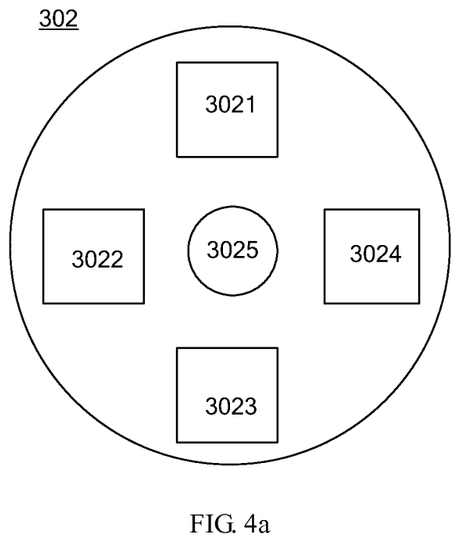
FIG. 4a shows a schematic view of a beam splitter unit of the cyclic delay unit in accordance with the present invention.
Figure 4B:
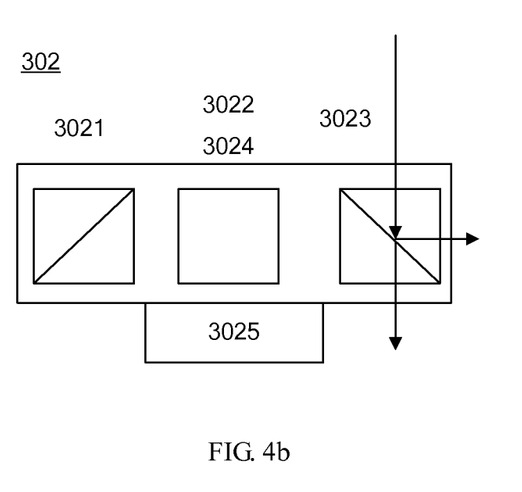

Referring to FIGS. 4a and 4b, where FIG. 4a is a schematic showing the beam splitter unit of the cyclic delay unit in accordance with the present invention, and FIG. 4b shows a side view of FIG. 4a. The beam splitter unit 302 may include a plurality of first beam splitters with different transmittances and a pivot 3025. In this embodiment, the beam splitter unit 302 has four first beam splitters 3021, 3022, 3023 and 3024, and the internal control module 307 drives the pivot 3025 to switch the first beam splitter in use so as to control the light-splitting ratio of the beam splitter unit 302. The transmittances of the four first beam splitters 3021, 3022, 3023 and 3024 are a1, a2, a3 and a4, respectively. Upon receiving the command indicative of the beam-splitting ratio from the master controller 600, the internal control module 307 drives the pivot 3025 of the beam splitter unit 302 to pivot so as to switch the first beam splitter in use. Hereinafter, the transmittance of the first beam splitter in use is indicated at the reference character a. As such, using different first beam splitters can provide different transmittances.

Preferably, the first beam splitters 3021, 3022, 3023 and 3024 are spaced the same distance from the pivot 3025. This can provide convenience in putting a first beam splitter of interest in use.

Preferably, the laser beam generator includes a laser 100, a dimmer 101, a second beam-splitter 102, an energy detector 105, a laser controller 104 and an environmental control unit 103. The single-pulse laser beam provided by the laser 100 is split by the second beam-splitter 102 after it has passed through the dimmer 101. The major part of the split laser beam enters the cyclic delay unit 300, with the rest part entering the energy detector 105. The energy detector 105 measures the energy of the laser and transfers the measurement results to the laser controller 104. The environmental control unit 103 obtains information (e.g., temperature information) about an operating environment of the laser 100 and transfers the information to the laser controller 104. Afterward, the laser controller 104 controls the operation of the laser 100 based on the results from the energy detector 105 and the information from the environmental control unit 103. Further, the laser controller 104 is connected to the master controller 600 and thereby under control of the master controller 600.

Preferably, the optical module includes a beam expander 206, a beam homogenizer 203, a first focusing lens group 202, a third beam splitter 207, a second focusing lens group 209 and a focal plane detector 201. After exiting the cyclic delay unit 300, the plurality of pulsed laser beams successively passes through the beam expander 206 and beam homogenizer 203 and is then split by the third beam splitter 307. Thereafter, a part of each of the plurality of split pulsed laser beams passes through the first focusing lens group 202 and is thereby directed onto a surface of the substrate 204, and the other part of each of the plurality of split pulsed laser beams passes through the second focusing lens group 209 and is thereby directed onto the focal plane detector 201. The focal plane detector 201 then obtains focal plane information and outputs the information to the master controller 600. The master controller 600 controls movement of the movable stage 500 based on the focal plane information, so as to move the substrate 204 to an optimal focal plane position.

Figure 5:
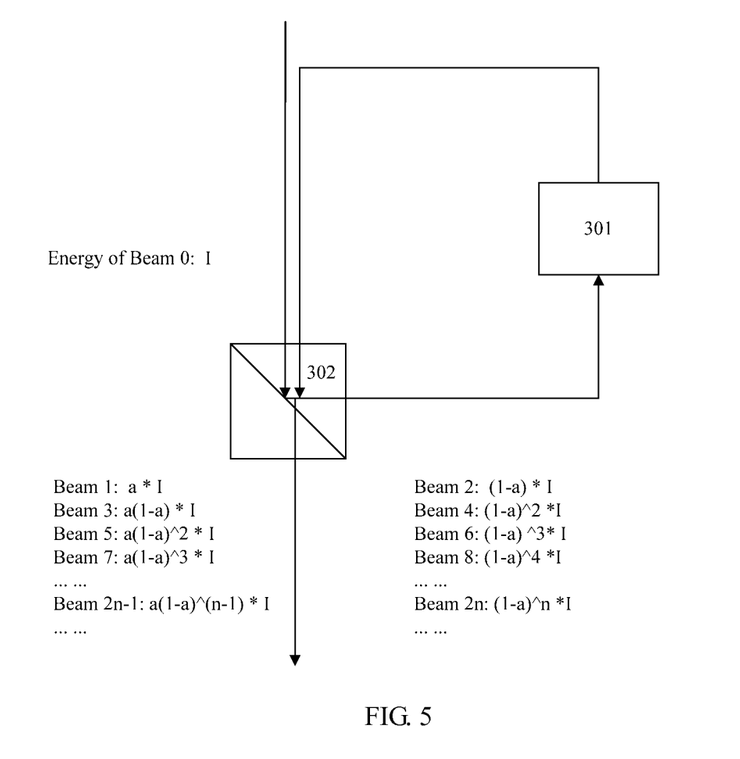
FIG. 5 diagrammatically depicts energies of laser beams generated in the cyclic delay unit in accordance with the present invention.

Referring to FIG. 5 which diagrammatically illustrates intensities of the plurality of pulsed laser beams generated in the cyclic delay unit in accordance with the present invention. As shown in FIG. 5, with combined reference to FIGS. 1 and 2, the beam splitter unit 302 splits the single-pulse laser beam (Beam 0) that has exited the laser beam generator into two split beams according to a prescribed beam-splitting ratio a (i.e., the beam-splitting ratio a of the first beam splitter in use). One of the split beams (Beam 1) is directly guided out of the cyclic delay unit 300, for example, passes through the beam expander 206 and the beam homogenizer 203, successively. The other beam (Beam 2) is guided into the delayer 301, where it is delayed by the prescribed time delay T, and is then directed again onto the first beam splitter in use by the optical fibers 310.

In the first beam splitter in use, Beam 2 is further split into two beams according to the prescribed beam-splitting ratio a. One of the further split beams (Beam 3) is directly guided out of the cyclic delay unit 300, and the other beam (Beam 4) is guided into the delayer 301 to be delayed by the prescribed time delay T and then again directed by the optical fibers 310 onto the first beam splitter being used.

In the first beam splitter in use, Beam 4 is still further split into two beams. One of the still further split beams (Beam 5) is directly guided out of the cyclic delay unit 300, and the other beam (Beam 6) is guided into the delayer 301 to be delayed by the prescribed time delay T and then again directed by the optical fibers 310 onto the first beam splitter being used.

By repeating this process, Beams 0, 1, 2, 3, 4, 5, 6, . . . , 2n−1 and 2n, can be obtained, with respective energies of 1, a, 1−a, a(1−a), $(1−a)^2$, $a(1−a)^2$, $(1−a)^3$, . . . , $a(1−a)^{(n−1)}$ and $(1−a)^n$.

Those beams actually reaching the beam homogenizer 302 are the odd-number-th beams, i.e., Beams 1, 3, 5, . . . , 2n−1 with respective energies of:

a, a(1−a), $a(1−a)^2$, . . . , $a(1−a)^{(n−1)}$.

Each of these odd-number-th beams is applied with the time delay T that is set as 200 ns in this embodiment. Considering that lasers employed in most existing laser annealing apparatuses generally produce laser beams with frequencies f in the range of 0.1 kHz to 10 kHz, there exists the relation 1/f>>T. In this embodiment, f=1 kHz.

After being homogenized by the beam homogenizer 302 along a non-scanning direction, these odd-number-th beams (i.e., Beams 1, 3, 5, . . . , 2n−1) are sequentially irradiated on the substrate 204 supported on the movable stage 500.

In this embodiment, the beam-splitting ratio a is prescribed as 30%. Accordingly, the energies of the n odd-number-th beams reaching the beam homogenizer 302 are obtained as 0.3, 0.21, 0.147, 0.1029, 0.07203, 0.050421, . . . , $0.3*0.7^{(2*n−1)}$, . . . .

Figure 6:
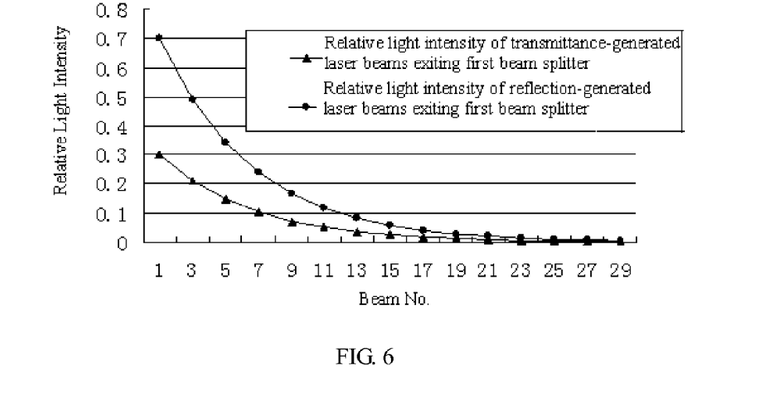
FIG. 6 plots relative light intensities of the laser beams corresponding to the energies in accordance with the present invention.
Figure 7:
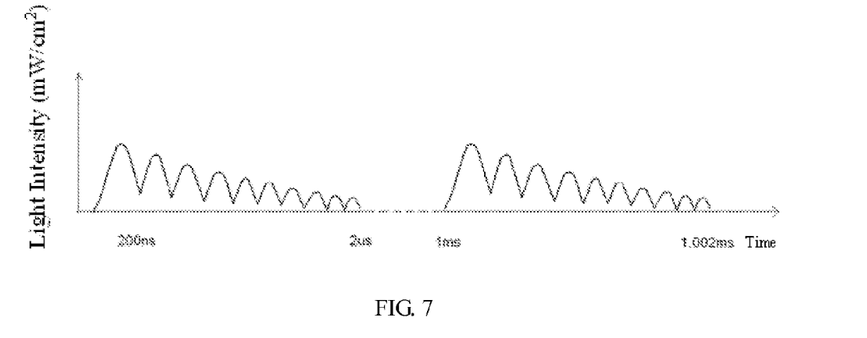
FIG. 7 plots a curve depicting the time profile of the intensity of the laser beam light applied on a substrate surface in accordance with the present invention.

Energies of the obtained laser beams are presented in Table 1 and FIG. 6. Table 1 presents relationships between the laser beams of the cyclic delay unit 300 and their corresponding relative light intensities, while FIG. 6 plots energy contribution of relative light intensities of the laser beams of the cyclic delay unit 300 in accordance with the present invention. As can be seen from FIG. 7, which shows the time profile of the intensity of the laser beam light applied on the surface of the substrate 204 in accordance with the present invention, the single-pulse laser beam emitted from the laser 100 is split into a sequence of pulses exponentially decreasing in energy by the cyclic delay unit 300. In this embodiment, the two reflectors 304 and 305 of the cyclic delay unit 300 are both 1 m high and are spaced 1 m apart, and the orientation (i.e. the angle θ that the transmitter 303 allows laser beams to exit at) is 0.95°, so the total optical path length is adjusted to 60 m. As a result, each split pulse is delayed by 200 ns. Further, as f=1 kHz in this embodiment, the laser 100 provides a single-pulse laser beam at an interval of 1 ms.

TABLE 1

| Sequence No. of laser beams exiting the cyclic delay unit | Sequence No. of split beams (transmission beams from the first beam splitter) | Relative light intensities (transmission beams from the first beam splitter) | Sequence No. of split beams (reflected beams from the first beam splitter) | Relative light intensities (reflected beams from the first beam splitter) |
| --- | --- | --- | --- | --- |
| 1 | 1 | 0.3 | 2 | 0.7 |
| 2 | 3 | 0.21 | 4 | 0.49 |
| 3 | 5 | 0.147 | 6 | 0.343 |
| 4 | 7 | 0.1029 | 8 | 0.2401 |
| 5 | 9 | 0.07203 | 10 | 0.16807 |
| 6 | 11 | 0.050421 | 12 | 0.117649 |
| 7 | 13 | 0.0352947 | 14 | 0.082354 |
| 8 | 15 | 0.0247063 | 16 | 0.057648 |
| 9 | 17 | 0.0172944 | 18 | 0.040354 |
| 10 | 19 | 0.0121061 | 20 | 0.028248 |
| 11 | 21 | 0.0084743 | 22 | 0.019773 |
| 12 | 23 | 0.005932 | 24 | 0.013841 |
| 13 | 25 | 0.0041524 | 26 | 0.009689 |
| 14 | 27 | 0.0029067 | 28 | 0.006782 |
| 15 | 29 | 0.0020347 | 30 | 0.004748 |

Figure 8:
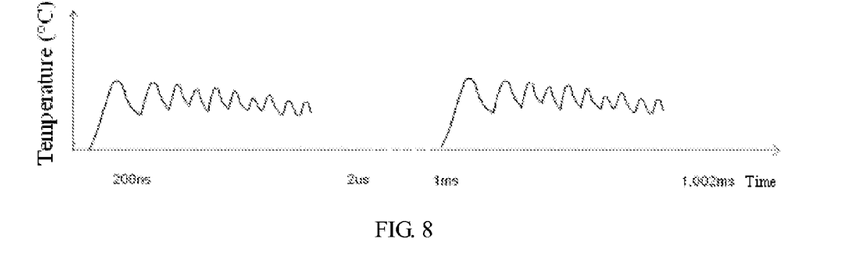
FIG. 8 plots a curve depicting the time profile of the temperature of the substrate surface in accordance with the present invention.

As disclosed in the prior art of "Laser Annealing of Double Implanted Layers for IGBT Power Devices" by Clement Sabatier et al., double-pulse laser annealing methods can realize dispersion of laser energy and hence have a better annealing effect than that of single-pulse methods. The present invention can split a single-pulse laser beam into multiple pulsed laser beams without needing additional lasers, thus can achieve a further improved annealing effect than the double-pulse annealing with low cost. In addition, compared to the conventional pulse width adjustment methods that are associated with a number of problems, such as, for example, causing the temperature of the substrate being treated to exceed the melting point of the substrate material a certain time after the start of the annealing process and thus leading to intensive and increased reflection of the incident laser energy, and causing continuously increasing substrate temperature during the annealing process and thus leading to increasingly higher thermal radiation and the volatilization of ions implanted in the substrate, the present invention is capable of keeping the substrate surface temperature around the substrate material melting point for a sufficiently long time during the annealing process, as demonstrated in FIG. 8, by adjusting the beam splitting ratio a and the time delay T, thus resulting in an improvement in both the energy utilization efficiency and annealing effect.

Embodiment 2

Figure 3:
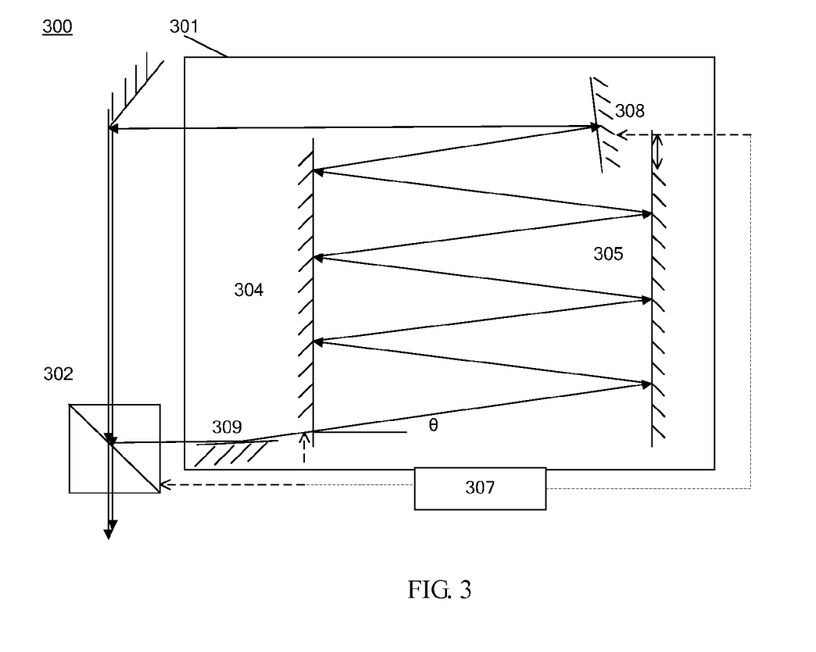
FIG. 3 shows a schematic view of Embodiment 2 of the cyclic delay unit of the laser annealing apparatus in accordance with the present invention.

Referring to FIG. 3 which shows a schematic view of the cyclic delay unit of the laser annealing apparatus in accordance with Embodiment 2 of the present invention, this embodiment differs from Embodiment 1 in: a cyclic delay unit 301 of this embodiment includes two main reflectors 304 and 305, an exit reflector 308 and an entrance reflector 309. Both the exit and entrance reflectors 308 and 309 are adjustable in position. With similarity to the cyclic delay unit of Embodiment 1 described in FIG. 2, this embodiment also has the ability to adjust the total optical path length to allow time delay adjustment. In addition, as the exit and entrance are respectively implemented as the exit and entrance reflectors 308 and 309 in this embodiment, the delayer 301 may accordingly include reflective optical member(s) having the same function of transmitting laser beams in lieu of the optical fibers 310. Similarly, this embodiment can keep the substrate surface temperature around the substrate material melting point for a sufficiently long time, as demonstrated in FIG. 8, by adjusting the beam splitting ratio a and the time delay T, thus can result in an improvement in both the energy utilization efficiency and annealing effect.

Embodiment 3

According to another aspect, the invention also provides a laser annealing method. With reference to FIGS. 1 to 8, the present invention is not limited thereto as the method may employ other annealing apparatuses than those described in the above Embodiments 1 and 2. The method includes:

providing a stable single-pulse laser beam;

splitting the single-pulse laser beam into a plurality of pulsed laser beams according to a desired time delay and an energy ratio; and irradiating a substrate 204 successively with the plurality of pulsed laser beams to stabilize a surface temperature of the substrate 204 within a predetermined range.

Preferably, splitting the single-pulse laser beam into the plurality of pulsed laser beams according to the desired time delay and the energy ratio specifically includes:

a) selecting a first beam splitter according to a preset beam-splitting ratio;

b) splitting the single-pulse laser beam into two split beams with the first beam splitter, irradiating the substrate 204 with one of the two split beams, and delaying the other of the two split beams by the desired time delay with a delayer 301;

c) splitting the other of the two split beams that has exited the delayer 301 into two further split beams with the first beam splitter, irradiating the substrate 204 with one of the two further split beams, and delaying the other of the two further split beams by the desired time delay with the delayer 301; and d) repeating step c), or selecting another first beam splitter according to another preset beam-splitting ratio and repeating step c).

Preferably, the delayer 301 includes: two reflectors 304 and 305 having parallel reflecting surfaces; and an entrance and an exit, each being adjustable in orientation or position, and adjusting the orientation and/or position of each of the entrance and the exit results in an adjustment in the time delay of the delayer. Preferably, the entrance and exit are implemented as a receiver 303 and a transmitter 306, respectively, as shown in FIG. 2, or the entrance and exit are implemented as an entrance reflector 309 and an exit reflector 308, respectively, as shown in FIG. 3.

In conclusion, the laser annealing apparatus and method of the invention are capable of an improvement in both laser energy utilization efficiency and annealing effect by splitting a single-pulse laser beam into multiple pulsed laser beams according to a desired time delay and an energy ratio and irradiating a target wafer successively with the multiple laser beams, so as to keep a surface temperature of the wafer around the wafer material melting point or around a needed annealing temperature for a sufficiently long time during the annealing process.

Obviously, those skilled in the art may make various modifications and alterations without departing from the spirit and scope of the invention. It is therefore intended that the invention be construed as including all such modifications and alterations insofar as they fall within the scope of the appended claims or equivalents thereof.

What is claimed is:

1. A laser annealing apparatus, comprising:
   a laser beam generator for providing a stable single-pulse laser beam;
   a cyclic delay unit for splitting the single-pulse laser beam into a plurality of pulsed laser beams;
   an optical module for converging one or more of the plurality of pulsed laser beams on a substrate; and
   a movable stage for providing the substrate with a movement in at least one degree of freedom,
   wherein the cyclic delay unit at least includes a delayer, a beam splitter unit and an internal control module; and the internal control module is configured to control a time delay of the delayer and a beam-splitting ratio of the beam splitter unit, and
   wherein the beam splitter unit includes a plurality of first beam splitters having different transmittances and a pivot; and the internal control module controls the beam-splitting ratio of the beam splitter unit by driving the pivot to switch the first beam splitter in use.

2. The laser annealing apparatus of claim 1, wherein the cyclic delay unit further includes a plurality of optical fibers for transmitting laser beams between the beam splitter unit and the delayer.

3. The laser annealing apparatus of claim 1, wherein the delayer includes: two reflectors having parallel reflecting surfaces; and an entrance and an exit, each adjustable in an orientation or a position.

4. The laser annealing apparatus of claim 3, wherein the entrance and the exit are implemented as a receiver and a transmitter, respectively, or an entrance reflector and an exit reflector, respectively.

5. The laser annealing apparatus of claim 3, wherein the internal control module controls the time delay of the delayer by adjusting the orientation or position of any or both of the entrance and the exit.

6. The laser annealing apparatus of claim 1, wherein the first beam splitters are spaced a same distance from the pivot.

7. The laser annealing apparatus of claim 1, further comprising a master controller which is connected to the internal control module, wherein the master controller is configured to send a command indicative of a time delay and a beam-splitting ratio to the internal control module.

8. The laser annealing apparatus of claim 7, wherein the laser beam generator includes a laser, a dimmer, a second beam-splitter, an energy detector, a laser controller and an environmental control unit; the laser beam is provided by the laser and is split into a major part and a minor part by the second beam-splitter after the laser beam has passed through the dimmer; the major part of the laser beam enters the cyclic delay unit; the minor part of the laser beam enters the energy detector; the energy detector measures the energy of the minor part of the laser beam and transfers the measurement results to the laser controller; the environmental control unit obtains operating environment information of the laser and transfers the operating environment information to the laser controller; the laser controller controls the laser based on the measurement results from the energy detector and the operating environment information from the environmental control unit; and the laser controller and the environmental control unit are both under control of the master controller.

9. The laser annealing apparatus of claim 7, wherein the optical module includes a beam expander, a beam homogenizer, a first focusing lens group, a third beam splitter, a second focusing lens group and a focal plane detector; each of the plurality of pulsed laser beams, exited from the cyclic delay unit, successively passes through the beam expander and the beam homogenizer and is then split into a first part and a second part by the third beam splitter; the first part of each of the plurality of pulsed laser beams passes through the first focusing lens group and is thereby directed onto a surface of the substrate; the second part of each of the plurality of pulsed laser beams passes through the second focusing lens group and is thereby directed onto the focal plane detector; the focal plane detector obtains focal plane information and outputs the focal plane information to the master controller; and the master controller controls movement of the movable stage based on the focal plane information, so as to move the substrate to an optimal focal plane position.

* * * * *